US008254167B2

(12) United States Patent
Patapoutian et al.

(10) Patent No.: US 8,254,167 B2
(45) Date of Patent: Aug. 28, 2012

(54) JOINT ENCODING OF LOGICAL PAGES IN MULTI-PAGE MEMORY ARCHITECTURE

(75) Inventors: Ara Patapoutian, Hopkinton, MA (US); Deepak Sridhara, Boulder, CO (US); Bruce D. Buch, Westborough, MA (US)

(73) Assignee: Seagate Technologies LLC, Scotts Valley, CA (US)

( * ) Notice: Subject to any disclaimer, the term of this patent is extended or adjusted under 35 U.S.C. 154(b) by 271 days.

(21) Appl. No.: 12/781,774

(22) Filed: May 17, 2010

(65) Prior Publication Data

US 2011/0280068 A1  Nov. 17, 2011

(51) Int. Cl.
*G11C 16/04* (2006.01)
(52) U.S. Cl. ............. 365/185.03; 365/185.12; 711/103; 714/763
(58) Field of Classification Search ............. 365/185.03, 365/185.12, 185.21; 711/103, 118; 714/759, 714/763
See application file for complete search history.

(56) References Cited

U.S. PATENT DOCUMENTS

| | | | |
|---|---|---|---|
| 6,522,580 B2 | 2/2003 | Chen et al. | |
| 7,411,858 B2 | 8/2008 | Ju | |
| 7,593,259 B2 | 9/2009 | Kim | |
| 7,596,022 B2 | 9/2009 | Chae et al. | |
| 7,652,929 B2* | 1/2010 | Li | 365/185.24 |
| 7,848,144 B2* | 12/2010 | Lasser | 365/185.12 |
| 2008/0177934 A1 | 7/2008 | Yu et al. | |
| 2011/0185257 A1* | 7/2011 | Vogelsang | 714/763 |
| 2012/0079178 A1* | 3/2012 | Litsyn et al. | 711/103 |

FOREIGN PATENT DOCUMENTS

WO  WO 2009/114618  9/2009

OTHER PUBLICATIONS

Caire et al., "Bit-Interleaved Coded Modulation", IEEE Transactions on Information Theory, vol. 44, No. 3, May 1998, pp. 927-946.
Gregori et al., "An Error Control Code Scheme for Multilevel Flash Memories", IEEE, 2001, 5 pages.
Imai et al., "A New Multilevel Coding Method Using Error-Correcting Codes", IEEE Transactions on Information Theory, vol. 23, No. 3, 1977, pp. 371-377.
Wachsmann et al., "Multilevel Codes: Theoretical Concepts and Practical Design Rules", IEEE Transactions on Information Theory, vol. 45, No. 5, Jul. 1999, pp. 1361-1391.
U.S. Appl. No. 12/781,780, filed May 17, 2010, Patapoutian.

* cited by examiner

*Primary Examiner* — Huan Hoang
(74) *Attorney, Agent, or Firm* — Hollingsworth Davis, LLC

(57) ABSTRACT

Multiple logical pages are jointly encoded into a single code word and are stored in the same physical page of a solid state non-volatile memory (NVM) device having multi-level memory cells. A first logical page of the multiple logical pages is stored in the memory device as first bits of the multi-level memory cells while a second logical page of the multiple logical pages is temporarily cached. After the first logical page is stored as the first bits of the memory cell, the second logical page is stored as second bits of the memory cells.

20 Claims, 14 Drawing Sheets

| Joint code word 1 | Physical page 1 | 1st page written | MSB Page 1 |
|---|---|---|---|
| | | 5th page written | LSB Page 2 |
| Joint code word 2 | Physical page 2 | 2nd page written | MSB Page 3 |
| | | 6th page written | LSB Page 4 |
| Joint code word 3 | Physical page 3 | 3rd page written | MSB Page 5 |
| | | 7th page written | LSB Page 6 |
| Joint code word 4 | Physical page 4 | 4th page written | MSB Page 7 |
| | | 8th page written | LSB Page 8 |

*Figure 5A*

| Physical page 1 Joint code word 1 | Physical page 2 Joint code word 2 | Physical page 3 Joint code word 3 | Physical page 4 Joint code word 4 | |
|---|---|---|---|---|
| 1st page written | 2nd page written | 3rd page written | 4th page written | MSB pages |
| Jth page written | J+1 page written | J+2 page written | J+3 page written | LSB pages |

*Figure 5B*

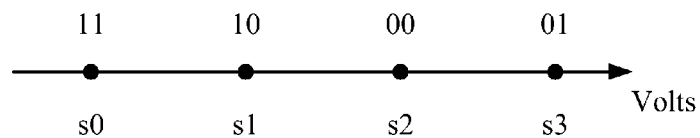

*Figure 6*

JOINT ENCODING OF LOGICAL PAGES IN MULTI-PAGE MEMORY ARCHITECTURE

SUMMARY

Embodiments of the invention are generally directed to approaches for encoding and storing data in a solid state non-volatile memory (NVM) device having multi-level memory cells.

A method of storing data in a solid state NVM device includes jointly encoding multiple logical pages of data into a single joint code word that includes data bits and parity bits. The jointly encoded logical pages are stored in a physical page of the memory cells of the memory device. Each of the memory cells is configured to store multiple bits including at least a first bit and a second bit. A first logical page of the multiple logical pages is stored in the memory device as first bits of the memory cells while a second logical page of the multiple logical pages is temporarily cached. After the first logical page is stored as the first bits of the memory cell, then the second logical page is stored as second bits of the memory cells.

In some implementations, the multiple logical pages are jointly encoded using a low density parity check code. All of the parity bits of the joint code word can be stored in the first logical page or all the parity bits of the joint code word can be stored in the second logical page or some of the parity bits can be stored in the first logical page and some of the parity bits can be stored in the second logical page. The first logical page has a first error rate and the second logical page has a second error rate that is different from the first error rate. In some implementations, the first logical page and the second logical page are not concurrently written into the memory cells and/or are not consecutively written into the memory cells. For example, one or more pages of data can be stored in the memory cells between storing the first logical page and storing the second logical page.

In some scenarios, each of the memory cells is capable of storing more than two bits of data. In these scenarios, storing the jointly encoded logical pages includes, after storing the first logical page as the first bits of the memory cells of the physical page and storing the second logical page as the second bits of the memory cells of the physical page, storing one or more additional logical pages as one or more additional bits of the memory cells of the physical page. The second and additional logical pages are cached while the first logical page is written to the memory cells, and the additional logical pages are cached while the second logical page is written to the memory cells.

Some configurations of the memory device are arranged so that only one physical page is accessible by activating a word line. Some configurations of the memory device are arranged so that more than one physical page is accessible by activating a word line. For multi-level cells, each physical page is capable of storing multiple jointly encoded logical pages, one logical page for each bit of the memory cells. For example, if the memory cells are capable of storing 2 bits, then the number of jointly encoded logical pages is two. If the memory cells are capable of storing 3 bits, then the physical page may store three logical pages and two or three of the logical pages may be jointly encoded.

The method further involves iteratively decoding the jointly encoded logical pages. The voltage levels of the memory cells are sensed. Responsive to the sensed voltage levels, the jointly encoded logical pages are demodulated to provide a demodulated output for each logical page of the multiple logical pages. The multiple logical pages are decoded and a decoded output for each logical page of the multiple pages is generated. Generating the decoded output for each logical page involves receiving the demodulated output for the logical page in the decoder wherein the logical page is decoded responsive to the demodulated output. The decoding and demodulating processes proceed iteratively, including exchanging information between the decoding and the demodulating. For example, exchanging information may involve exchanging one or both of hard data estimates and data confidence information.

A solid state non-volatile memory device includes a joint encoder configured to jointly encode multiple logical pages of data in a single code word. A modulator is configured to store the jointly encoded logical pages into a physical page of the memory cells of the memory device. Each of the memory cells is arranged to store multiple bits including at least a first bit and a second bit. A cache temporarily caches a second logical page of the multiple logical pages while a first logical page of the multiple logical pages is being stored in the memory cells. The modulator is configured to retrieve the second logical page from the cache and to store the second logical page as second bits of the memory cells after storing the first logical page. Storing the first logical page as the first bits of the memory cells and the second logical page as the second bits of the memory cells results in storage of the joint code word in two logical pages of a physical page of the memory device. For example, the joint encoder may jointly encode the multiple logical pages using a low density parity check code.

The modulator may store at least one logical page, at least two logical pages, or more than two logical pages of data in the memory device between storing the first logical page in the memory cells and storing the second logical page in the memory cells.

In some configurations, the memory cells are capable of storing more than two bits of data and in these configurations, more that two logical pages may be jointly encoded.

The memory cells can be arranged so that only one physical page is accessible by activating a word line. In other arrangements, more than one physical page is accessible by activating a word line. Each physical page is capable of storing multiple jointly encoded logical pages.

The device may additionally include sensor circuitry configured to sense voltage levels indicative of the multiple bits stored in the memory cells. A demodulator provides a demodulated output for each logical page of the multiple pages responsive to the sensed voltage levels. A decoder receives a demodulated output for each logical page of the multiple pages from the demodulator and sends an output to the demodulator. The decoder and the demodulator exchange information and iteratively perform the processes of decoding and demodulating the multiple pages. The information exchanged between the demodulator and the decoder may include data confidence information which the demodulator determines from a look-up table.

These and other features and aspects which characterize various embodiments of the invention can be understood in view of the following detailed discussion and the accompanying drawings.

BRIEF DESCRIPTION OF THE DRAWINGS

FIG. 5A illustrates a sequence of writing the jointly encoded MSB and LSB logical pages to physical pages of a memory cell array when one physical page corresponds to each row of transistors;

FIG. 5B illustrates a sequence of writing the jointly encoded MSB and LSB logical pages to physical pages of a memory cell array when more than one physical page corresponds to each row of transistors;

FIG. 6 illustrates voltage levels and corresponding binary states for two bit memory cells;

DETAILED DESCRIPTION

Figure 1A:
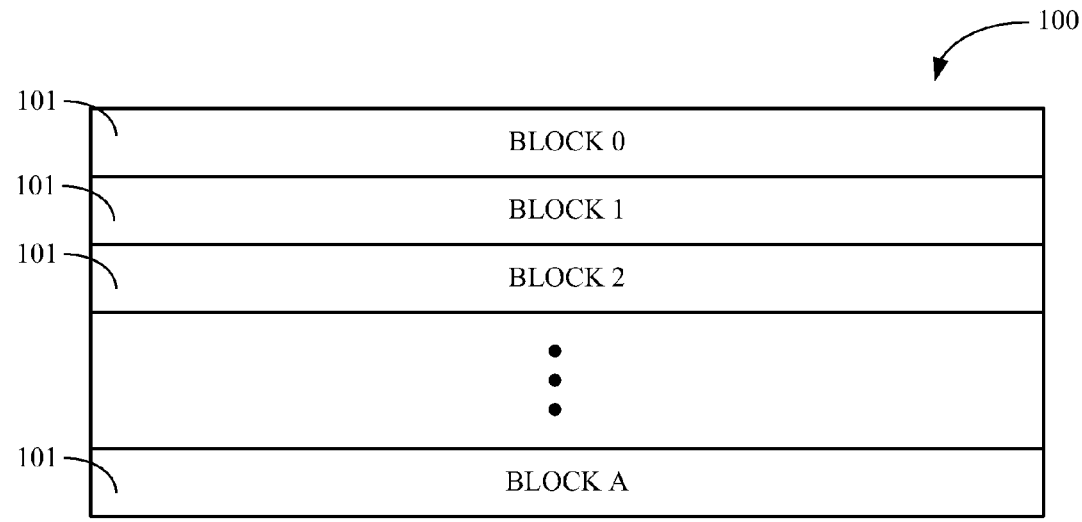
FIG. 1A is a diagram illustrating a memory cell array 100 arranged in A blocks.

Solid state non-volatile memory (NVM) devices capable of storing multiple bits per memory cell are attractive because they provide a significant increase in storage capacity per unit area over single level memory devices. Multi-level solid state NVM devices can be implemented using a multi-page architecture that stores multiple logical pages of data together in one physical page of memory. The multiple logical pages that are stored in one physical page of the NVM device can be jointly encoded using a single error correction coding (ECC) process.

Each logical page of a physical page may have a different error rate. The variations in the error rate of logical pages stored together in a physical page may be due to statistical variation experienced by each of the logical pages and/or differences in the impact of data retention on each of the logical pages, or on other factors, for example. Furthermore, each of the logical pages may have different susceptibilities to changes in the voltage level stored in the memory cells when nearby cells are written to (write disturb) or read from (read disturb).

If multiple logical pages are stored in the same physical page, errors present in one of the logical pages may dominate over errors in another of the logical pages. Jointly encoding the logical pages into a single code word is beneficial because the parity bits available for both the logical pages can be used to correct errors in the joint code word. Thus, the logical page with more errors can benefit from the additional parity bits of the joint code word, while the logical page with fewer errors does not require these parity bits.

Joint encoding of multiple logical pages stored in a physical page according to multi-page architecture allows the error rate burden to be shared between one or more logical pages. Multi-page architecture also offers an opportunity to use information gained in the demodulation/decoding process of one of the logical pages of the physical page to inform the demodulation/decoding process for other logical pages of the physical page. The demodulator and the decoders can iteratively share information about the multiple logical pages stored in the physical page to detect and/or correct data errors.

Multi-level solid state NVM uses floating gate memory cells that can be programmed to store two or more bits of information. In general, the ability to program a memory cell to a number of voltages, M, where M can represent any of $2^m$ memory states, allows m bits to be stored in each memory cell. In multi-level memory storage devices, m is greater than or equal to 2. For example, memory cells programmable to two voltages can store one bit of data; memory cells programmable to four voltages can store two bits per cell; memory cells programmable to eight voltages have a storage capacity of three bits per cell, etc. Although this disclosure generally provides examples based on multi-level NVM devices capable of storing two bits per cell, the techniques described herein can be extended to multi-level NVM capable of storing three, four, or more bits in each memory cell.

Figure 1B:
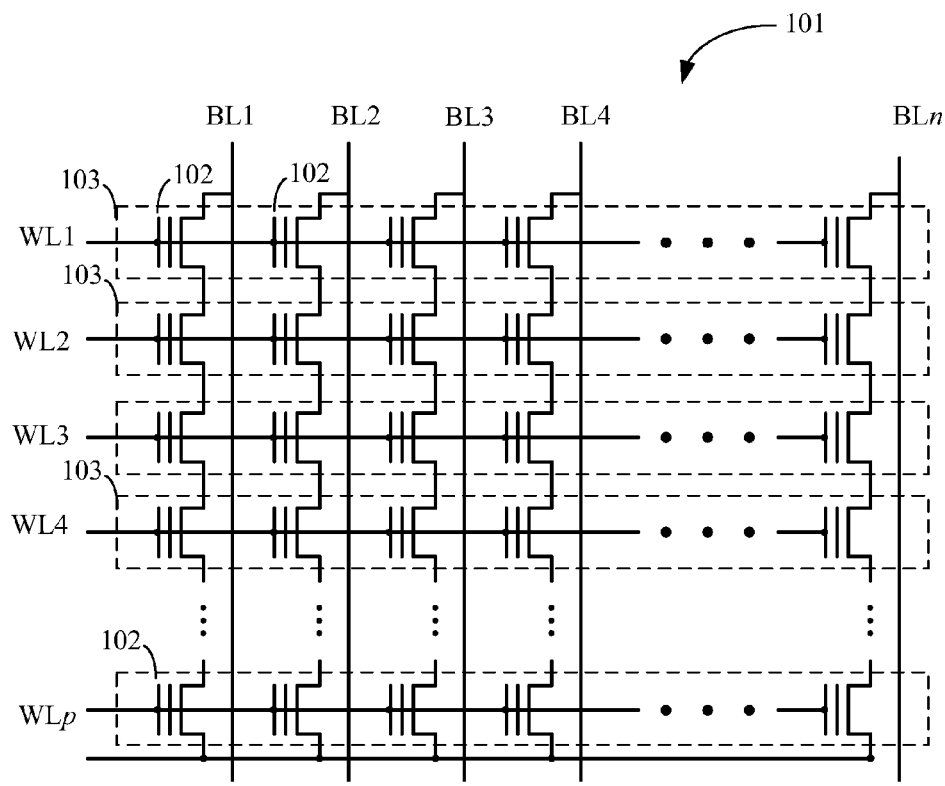
FIG. 1B is a diagram illustrating one block of a memory cell array having p rows and n NAND string columns.

A multi-level NVM device includes an array of memory cells, each memory cell comprising a floating gate transistor capable of storing multiple levels of charge. The memory cells in an array can be grouped into larger units, such as blocks, physical pages, and logical pages. An exemplary block size includes 64 physical pages of memory cells with 16,384 (16K) memory cells per physical page. Other block or page sizes can be used. FIG. 1A illustrates a memory cell array 100 arranged in A blocks 101. FIG. 1B illustrates one block 101 of a memory cell array. The memory cell array comprises p×n memory cells per block 101, the memory cells (floating gate transistors) 102 arranged p rows of physical pages 103 and in columns of n NAND strings. Each physical page 103 is associated with a word line $WL_1$-$WL_p$. When a particular word line is energized, the n memory cells of the physical page 103 associated with that particular word line are accessible on bit lines $BL_1$-$BL_n$. In alternate embodiments, the memory cells of the solid state NVM device may be arranged in a NOR array, for example.

Figure 1C:
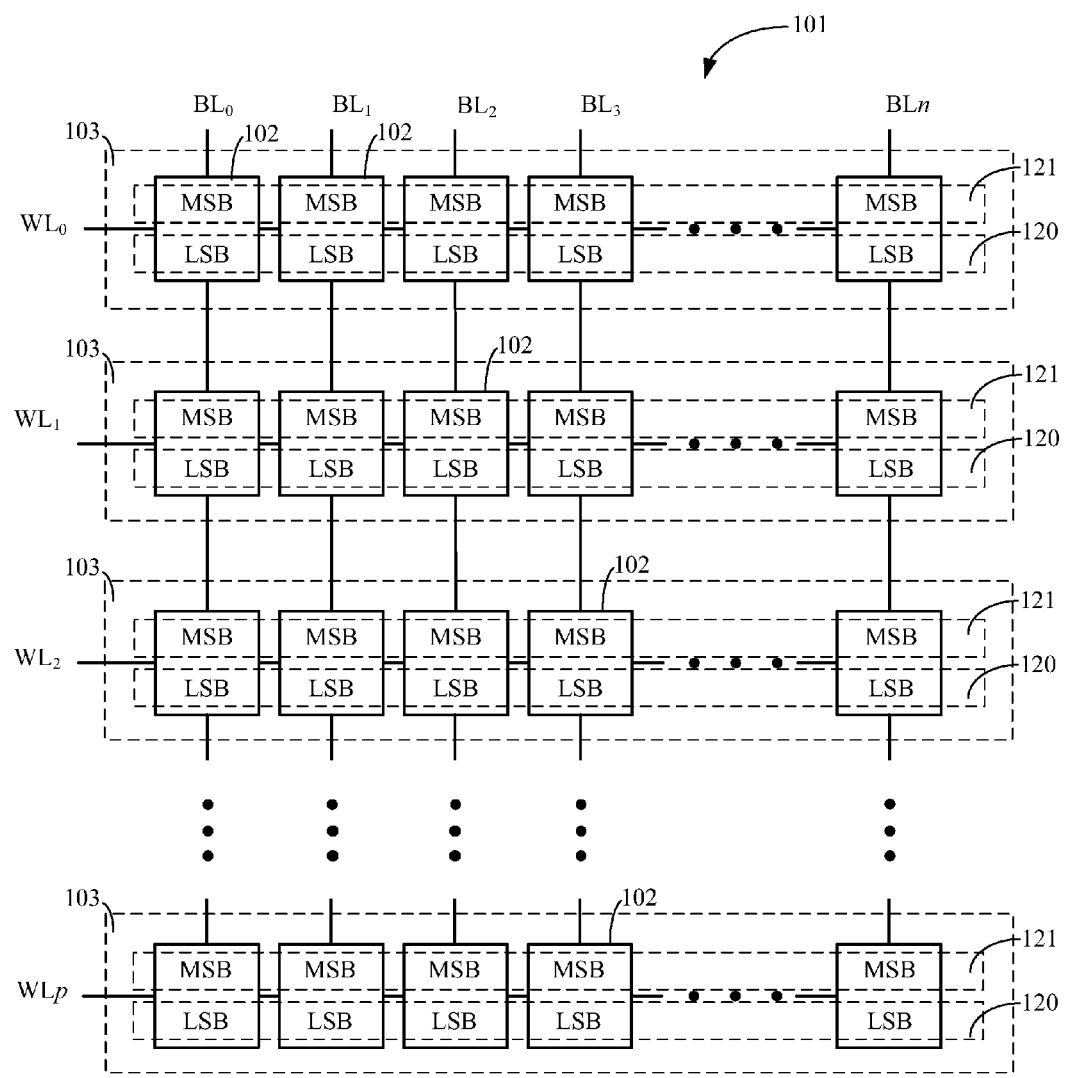
FIG. 1C illustrates memory cells capable of storing two bits of information in each cell, a most significant bit (MSB) and a least significant bit (LSB)

The exemplary memory array block 101 illustrated in FIGS. 1B and 1C includes multi-level memory cells (floating gate transistors) 102 that are programmable to multiple voltage levels. For example, the memory cells 102 may be programmable to four voltage levels and thus can store two bits of information per cell. FIG. 1C illustrates the block 101 of memory cells 102 that are capable of storing two bits of information denoted the most significant bit (MSB) and the least significant bit (LSB). Although this example involves multi-level memory cells that store two bits per memory cell, in general, multi-level memory cells may store three, four bits, five bits or even more bits per memory cell.

When multi-level memory cells are used to form the memory array, each physical page 103 can be subdivided into multiple logical pages 120, 121, as illustrated in FIG. 1C. One logical page 120, 121 for each type of bit is stored in the memory cells 102 of the physical page 103. Memory cell arrays that subdivide one physical page into multiple logical pages corresponding to the number of bits stored in multi-level memory cell is referred to herein as multi-page architecture. In the exemplary memory array block 101 illustrated in FIG. 1C, each physical page 103 associated with a word line $WL_1$-WLp is subdivided into two logical pages 120, 121. A first logical page 120 includes the LSBs of the memory cells 102 of the physical page 103. The second logical page 121 includes the MSBs of the memory cells 102 of the physical page 103. The logical pages 120, 121 associated with a physical page 103 are capable of being accessed (written or read) independently of each other. For example, the LSBs stored in the memory cells of the physical page may be accessed using a first logical page address at a first time and the MSBs stored in the memory cells of the physical page may be accessed using a second logical page address at a second time.

In some implementations, the memory cell array can be arranged so that a word line is associated with multiple physical pages and each physical page is further subdivided into multiple logical pages according to the number of bits stored by each memory cell.

Figure 2A:
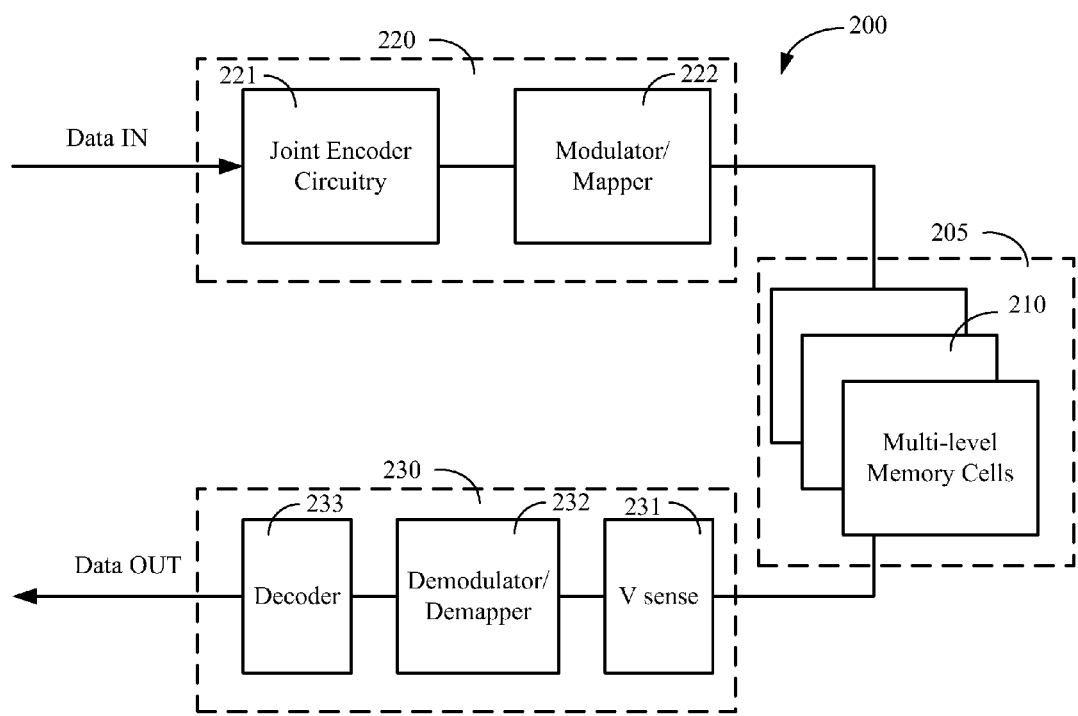
FIG. 2A is a block diagram of a multi-level non-volatile memory (NVM) device using multi-page architecture that is configured to jointly encode multiple logical pages into a single code word.

FIG. 2A is a block diagram of a multi-level solid state NVM device 200. The device 200 includes a memory cell array 205 comprising multi-level memory cells 210, input circuitry 220 configured to jointly encode the logical pages and to write data to the memory cells 210, and output circuitry 230 configured to read data from the memory cells 210 and decode the jointly encoded pages. Error correction coding (ECC) is used to detect and/or correct data errors present in the data when the data is read from the memory cell array 205. For example, the data may be encoded using a low density parity check (LDPC) code, a turbo code, a Bose-Chaudhuri-Hocquenghem (BCH) code, a Reed Solomon (RS) code, or other type of code. Error correction codes add redundant information as parity bits to the input data stream using a predetermined algorithm. Some error correction codes, such as BCH, operate on bits of information, whereas other error correction codes, Such as RS, operate on symbols (groups of bits).

The joint encoder circuitry 221 segregates the incoming data into logical pages and jointly encodes the logical pages into code words which are made up of the data bits and parity bits (redundant data). The logical pages which are eventually stored into one physical page of the memory device are jointly encoded into a single code word. The modulator/mapper 222 conditions the encoded data output from the encoder 221 to provide the signals required to program the multiple voltage levels into the memory cells 210. The logical pages of a physical page may be programmed into the memory cells at different times. For example, after the LSB and MSB logical pages to be stored in a physical page are jointly encoded, the bits of the MSB page of the physical page can be modulated and mapped into the memory cells 210 at a first time. At a second time, the bits forming the LSB page of the physical page are modulated and mapped in the memory cells 210 on top of the previously stored MSB page.

When data is read from the memory cells 210, voltage sense circuitry 231 senses the voltage levels present on the memory cells 210. The demodulator 232 converts the sensed voltages levels to encoded digital data. The decoder 233 decodes the encoded data and outputs decoded data for use by a host processor or other system component. In some implementations, the V sense circuitry 231 may be incorporated as a component of the memory cell array 205 and in some implementations, the V sense circuitry 231 may be incorporated in the demodulator, for example.

Figure 2B:
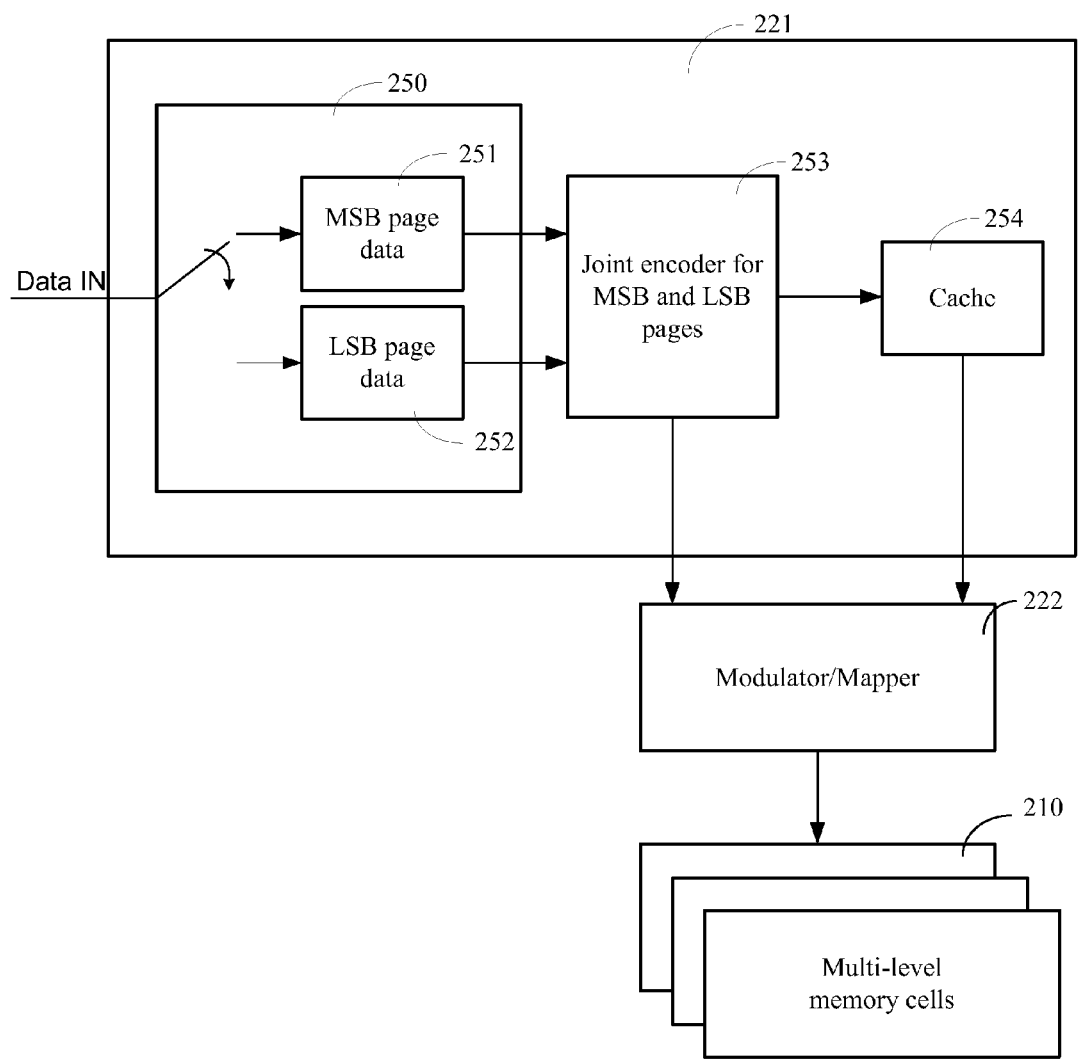
FIG. 2B is a block diagram that shows the joint encoder circuitry of FIG. 2A in more detail.

FIG. 2B is a block diagram that shows the joint encoder circuitry 221 in more detail. The joint encoder circuitry 221 includes a segregator 250, a joint encoder 253, and a cache 254. The segregator 250 segregates the incoming data into logical pages. The example illustrated in FIG. 2B includes memory cells 210 that are capable of storing two bits in each memory cell, thus the incoming data is segregated into MSB and LSB logical pages 251, 252. In other implementations, each of the memory cells may store three or more bits, allowing storage of a greater number of logical pages, e.g., an MSB page, an LSB page, and any number of intermediate significant bit (ISB) pages in each physical page.

In FIG. 2B, one MSB logical page 251 and one LSB logical page 252 are input to the joint encoder 253 where the MSB and LSB logical pages are jointly encoded into a single joint code word. The single code word includes data bits and parity bits that cover both the MSB page and the LSB page which are stored together in a physical page of the memory cells 210.

The modulator/mapper 222 is configured to produce signals to write the encoded pages in sequence into the memory cells 210. However, the MSB and LSB pages, e.g., of NAND memory arrays, that are jointly encoded into a single joint code word may not be written concurrently (both MSB and LSB pages written at the same time) into the physical page or consecutively (one page (MSB or LSB) written immediately before another page (LSB or MSB)) into the same physical page. Several logical pages may be written to the memory cells in between the time that the MSB page is written to a physical page and the time the LSB page is written into the same physical page. For example 2, 4, or more logical pages may be written between the time the MSB page is written and the time that the LSB page is written.

The solid state NVM device illustrated in FIG. 2B provides a cache 253 configured to temporarily store one or more logical pages prior to writing them to the memory cells 210. For example, after the first logical page (MSB or LSB page) is written into the physical page, the second logical page (LSB or MSB page) is temporarily stored in the cache 253 until it is time for the second logical page to be written into the physical page.

Figure 3A:
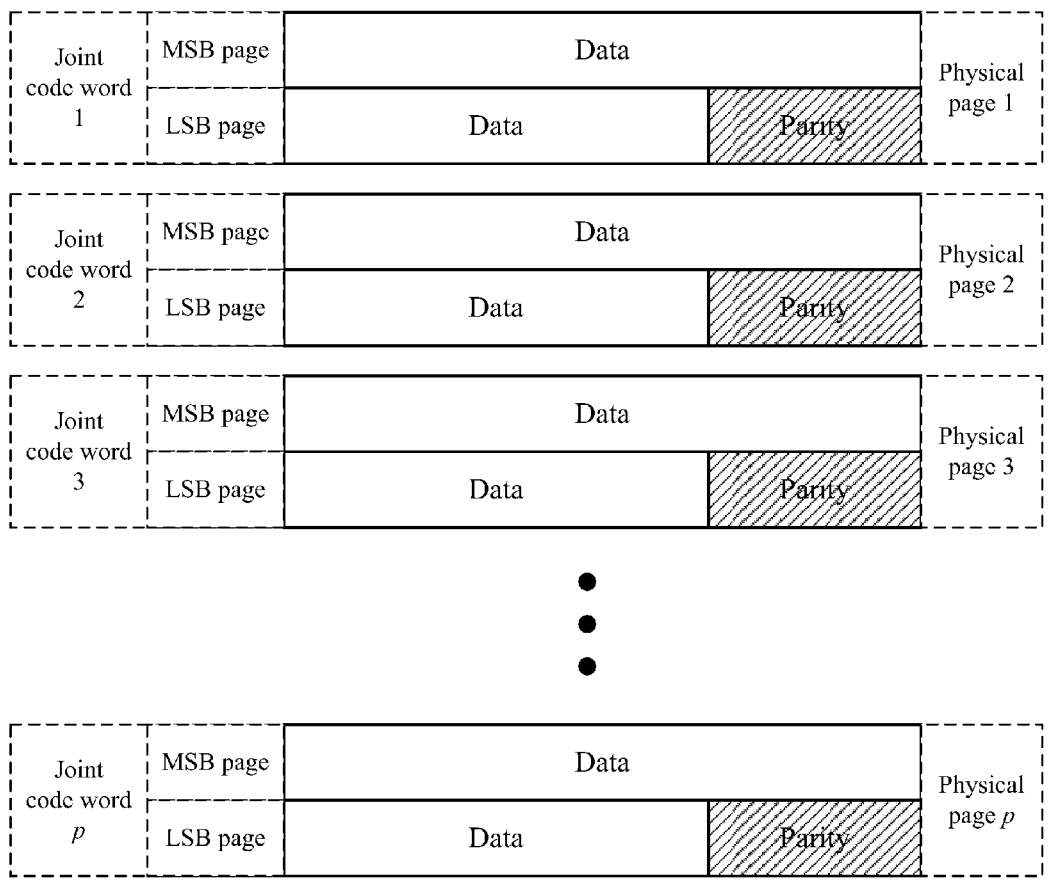
FIG. 3A illustrates a code word configuration in which one of the logical pages stores the parity bits of the joint code word.

FIG. 3A illustrates a code word configuration in which one of the logical pages stores the parity bits of the joint code word. In this example, joint code words 1 through p are stored into physical pages 1 through p. Each of the joint code words 1 through p include data bits and parity bits. The MSB logical page includes some data bits of the joint code word and the LSB logical page includes the remaining data bits and all of the parity bits for each of the joint code words 1-$p$. Alternatively, the LSB page may include some data bits and the MSB page may include the remaining data bits and all of the parity bits for the joint code word.

Figure 3B:
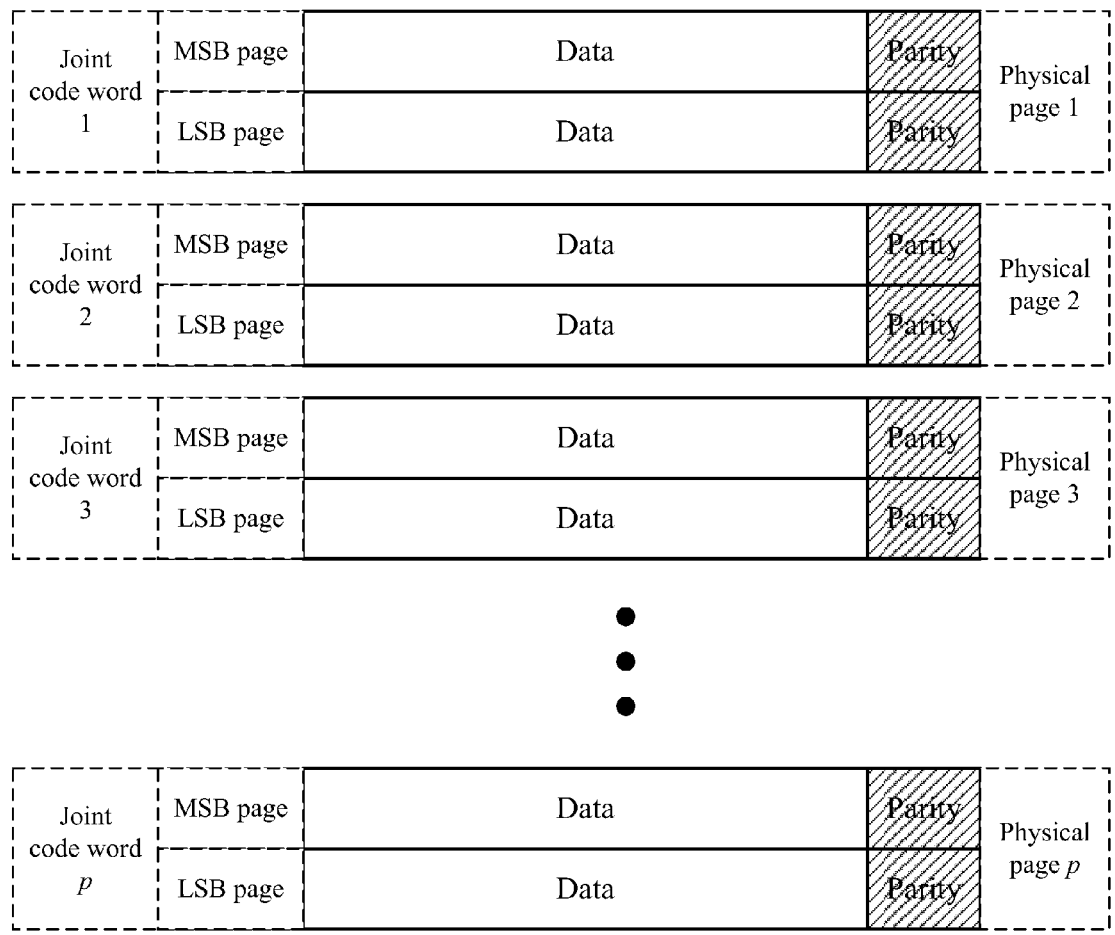
FIG. 3B illustrates a code word configuration in which both of the logical pages store the parity bits of the joint code word.

FIG. 3B illustrates another code word configuration wherein data bits and parity bits are stored in each of the logical pages included in the joint code word. FIG. 3B shows physical pages 1 through p in which joint code words 1 through p are stored. Each of the physical pages includes an MSB page and an LSB page. The MSB page stores some of the data bits and some of the parity bits. The LSB page stores some of the data bits and some of the parity bits.

Figure 4:
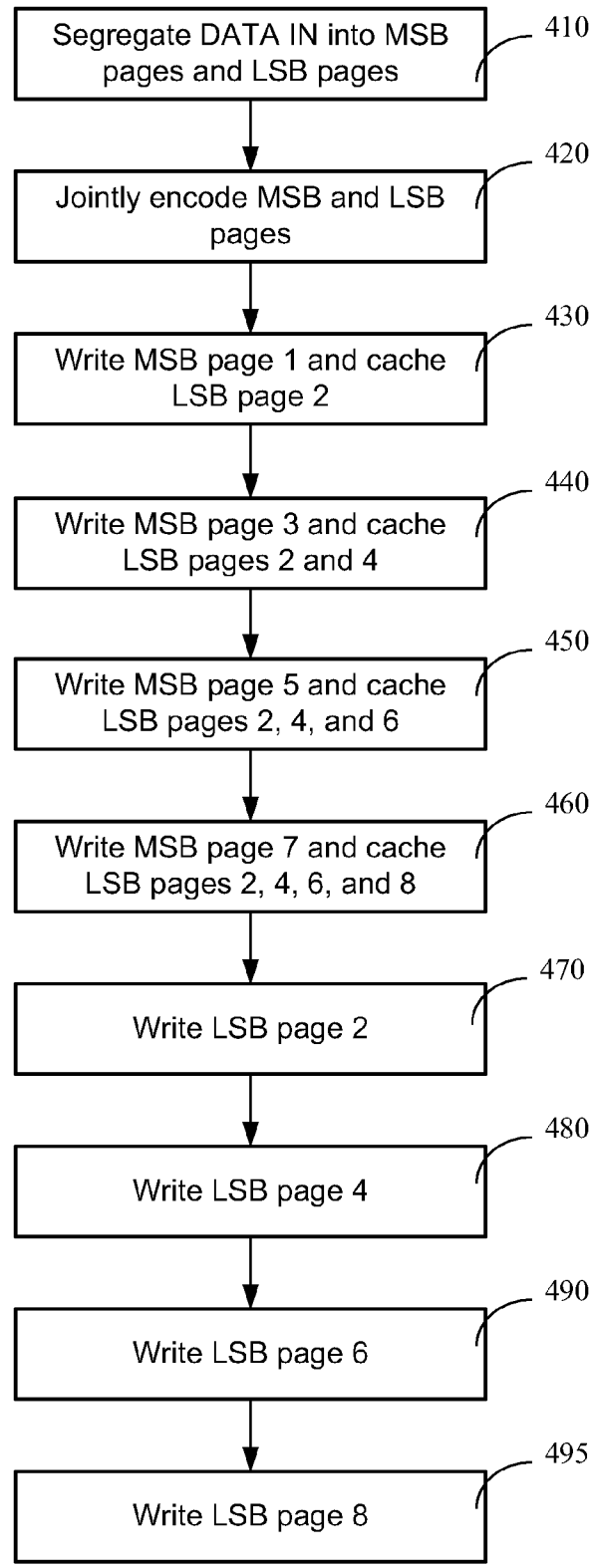
FIG. 4 is a flow diagram illustrating a process of jointly encoding MSB and LSB pages and writing the jointly coded pages to multi-level memory cells.

FIG. 4 is a flow diagram illustrating a process of jointly encoding MSB and LSB pages and writing the jointly coded pages to a physical page of the multi-level memory cells. As previously mentioned, some of the examples in this disclosure are provided for memory cells that store 2 bits per cell. It will be appreciated that the processes and devices described herein are not limited to 2 bit memory cells and may be used with memory cells capable of storing more than 2 bits per cell.

The data to be stored in the memory cells is segregated 410 into logical pages, e.g., MSB and LSB pages. The logical pages are jointly encoded 420, so that an MSB page and an LSB page are encoded by a single joint code word. The encoded pages are written sequentially into memory, however, the MSB and LSB pages to be stored into one physical page are not concurrently or consecutively written. The first MSB page (page 1) is written into the first physical page of the memory cells and the first LSB page (page 2) is stored in cache 430. The second MSB page (page 3) is written into the second physical page of the memory cells and the second LSB page (page 4) is stored in the cache 440. The third MSB page (page 5) into the third physical page of the memory cells and the third LSB page (page 6) is stored in the cache 450. The fourth MSB page (page 7) is written into the fourth physical page of the memory cells and the fourth LSB page (page 8) is stored in the cache 460. The first LSB page (page 2) is retrieved from the cache and is written into the first physical page of the memory cells 470. The second LSB page (page 4) is retrieved from the cache and is written into the second physical page of the memory cells 480. The third LSB page (page 6) is retrieved from the cache and is written into the third physical page of the memory cells 490. The fourth LSB page (page 8) is retrieved from the cache and is written into the fourth physical page of the memory cells 495.

FIGS. 5A and 5B illustrate the sequence of writing the jointly encoded MSB and LSB logical pages to a memory cell array. FIG. 5A illustrates a portion of a memory cell that includes 4 rows of floating gate transistors as previously illustrated in FIG. 1C. In this example, there is a one to one correspondence between physical pages and rows—only one physical page corresponds to each row. Each physical page includes multiple logical pages corresponding to the number of bits that the memory cells can store. The data stored in each physical page is encoded into a joint code word that spans the logical pages of the physical page. For example, MSB page 1 and LSB page 2 are encoded as joint code word 1 and are stored in a physical page 1 of the memory cell array; MSB page 3 and LSB page 4 are encoded as joint code word 2 and are stored in physical page 2 of the memory cell array; MSB page 5 and LSB page 6 are encoded as joint code word 3 and are stored in physical page 3 of the memory cell array; MSB page 7 and LSB page 8 are encoded as joint code word 4 and are stored in physical page 4 of the memory cell array.

FIG. 5A also illustrates the sequence of writing the jointly encoded pages. Page 1 (MSB page) of joint code word 1 is written first, followed by page 3 (MSB page) of joint code word 2, followed by page 5 (MSB page) of joint code word 3, followed by page 7 (MSB page) of joint code word 4. In this example, while pages 1, 3, 5, and 7 are being written to the memory cell array, pages 2, 4, 6, and 8 are stored in cache. After pages 1, 3, 5, and 7 are written to the memory cell array, then page 2 (LSB page) of joint code word 1 is written, followed by page 4 (LSB page) of joint code word 2, followed by page 6 (LSB page) of joint code word 3, followed by page 8 (LSB page) of joint code word 4.

In some implementations, one row of floating gate transistors may be arranged into multiple physical pages. FIG. 5B illustrates one row of transistors that corresponds to multiple physical pages, e.g., physical pages 1-4. Each physical page comprises multiple logical pages, one logical page for each bit of the memory cells. In this example, the memory cells are capable of storing 2 bits, and the logical pages of the physical pages 1-4 are designated the MSB pages and the LSB pages. Physical page 1 stores joint code word 1 comprising an MSB page and an LSB page; physical page 2 stores joint code word 2 comprising an MSB page and an LSB page; physical page 3 stores joint code word 3 comprising an MSB page and an LSB page; physical page 4 stores joint code word 4 comprising an MSB page and an LSB page. When the data is written into the memory cell, in this example, the MSB page of joint code word 1 is written into physical page 1 first; followed the MSB page of joint code word 2 which is written into physical page 2; followed by the MSB page of joint code word 3 which is written into physical page 3; followed by the MSB page of joint code word 4 which is written into physical page 4.

While the MSB pages are being written into physical pages 1-4, the LSB pages are stored in cache. After the MSB pages are written, and after one or more additional MSB pages of the memory device are written, the LSB page of joint code word 1 of physical page 1 is written into physical page 1 (the Jth page written), followed by the LSB page of joint code word 2 which is written into physical page 2 (the J+1 page written); followed by the LSB page of joint code word 3 which is written into physical page 3 (the J+2 page written); followed by the LSB page of joint code word 4 which is written into physical page 4 (the J+3 page written). For arrangements that include multiple physical pages per row, the interval between the time a first page (e.g., MSB page) is written into a physical page and the time that a last page (e.g., LSB page) is written into the same physical page may be greater than in the scenario depicted in FIG. 5A in which there is only one physical page per row.

FIG. 6 illustrates the voltage levels and corresponding binary states for 2 bit memory cells. For example, voltages s0, s1, s2, s3 may be stored in the memory cells using Gray coding to represent the two bit binary states 11, 10, 00, 01, respectively. Thus, when the memory cell stores voltage level s0, this state corresponds to an MSB equal to 1 and an LSB equal to 1. The s1 state corresponds to an MSB equal to 1 and an LSB equal to 0. The s2 state corresponds to an MSB equal to 0 and an LSB equal to 0. The s3 state corresponds to an MSB equal to 0 and an LSB equal to 1.

Figure 7:
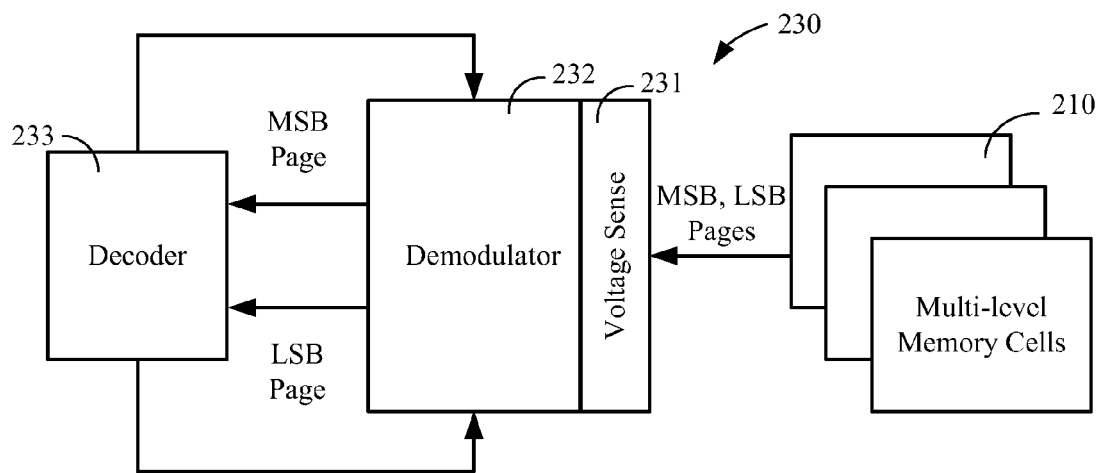
FIG. 7 is a block diagram of the output circuitry of a memory system that uses multi-page architecture.

FIG. 7 shows the output circuitry 230 illustrated in FIG. 2A in more detail. As previously discussed, the logical pages stored in a physical page of the memory cells 210 are encoded in a joint code word using error correction coding (ECC) to facilitate error detection and/or error correction. When the joint code words are read from the memory cells 210, voltage sense circuitry 231 senses the voltage present on the bit lines of the memory cells 210 as they are selected using the word lines. The demodulator 232 compares the sensed voltage of each memory cell 210 to one or more threshold voltages to determine the voltage level of the memory cell. Based on the comparison to the thresholds, the voltage level on each memory cell 210 can be translated into an m bit digital state, where m equals two for the four state memory cells 210 used in this example.

In addition to determining the digital state of the memory cells by comparison to thresholds as discussed above, the demodulator 232 may also determine data confidence information, denoted soft information, for each bit. Soft information provides a confidence level that the data reported by the demodulator corresponds to the data that was stored in the memory cell. Data errors may be introduced into the memory device at various times, causing the voltage stored in the memory cell or read from the memory cell to differ from the input data.

The demodulator can be configured to generate bit level soft information for the MSB bit and/or the LSB bit of a memory cell from symbol level soft information, where a symbol comprises the two bit code for the MSB and LSB bits stored in a memory cell. Soft information may be obtained by the demodulator from several sources. In some implementations, the voltage sensor may be configured to acquire soft information by comparing the sensed voltage to one or more additional thresholds. In a multi-level memory cell capable of storing two bits of information, the voltage sensor may provide an x bit information word to the demodulator. The demodulator takes this x bit information word from the voltage sensor and generates an estimate of each data bit stored in the memory cell along with soft information comprising a y-1 bit indication of the confidence of the estimate. For example, the demodulator output may include as little as 1 bit of soft information per data bit that is useful in the decoding process.

The demodulator may use prior information to generate bit level soft information. At the modulator and demodulator, consider an alphabet size of M, or m=$\log_2$ M bits. In the modulator, m binary bits $b_0 \, b_1 \ldots b_{m-1}$ are mapped to a signal level in $x \in \chi$, that is, $$\mu: \{0,1\}^m \to \chi \quad [1]$$

The prior probabilities are denoted by $p(b_k)$.

Let $l^i(x)$ denote the binary bit, or the label, on the ith bit of x. Let $\chi_b^i$ denote the subset of all $x \in \chi$ such that $l^i(x)=b$. For example, with m=2 and Gray mapping:

$$\{11, 10, 00, 01\} \to \{s_0, s_1, s_2, s_3\} \quad [2]$$

and $\chi_0^0=\{2,3\}$, $\chi_1^0=\{0,1\}$, $\chi_0^1=\{1,2\}$, $\chi_1^1=\{0,3\}$. For example, when the noise is additive Gaussian white noise (AGWN), the read sample $y_i$ for the ith memory state may be expressed as:

$$y_i = x_i + w(x_i), \quad [3]$$

where $x_i$ is the voltage that was stored in the memory cell, and $w(x_i)$ is a noise signal having a probability density function:

$$f(y \mid x_i) = \frac{1}{\sqrt{2\pi\sigma_i^2}} e^{\frac{(y-x_i)^2}{2\sigma_i^2}} \quad [4]$$

where $\sigma_i$ is the noise variance for the ith state.

For two bit memory cells, recall that the voltage stored in each cell corresponds to a two bit state. With Gray mapping, the two bit states $\{11, 10, 00, 01\}$ correspond to symbols $\{s_0, s_1, s_2, s_3\}$, as illustrated in FIG. 6. When the noise variance for each cell state is the same, then the error rate for the symbols is given by:

$$p_s = \frac{2(M-1)}{mM} Q\left(\frac{d}{2\sigma}\right) \quad [5]$$

where m is the number of bits that can be stored in a memory cell, M is the number of symbols (possible m-bit states), d is the distance the between the voltage levels of neighboring cells, $d=x_i-x_{i-1}$, and Q is the Gaussian error integral. If each symbol results in a single bit error, then the bit error rate is:

$$p_b = \frac{p_s}{m} \quad [6]$$

For each data bit of an LSB or MSB page, the demodulator 232 provides an output to the decoder 233 that includes an estimate of the state of the bit (either a 1 or a 0) along with the soft information which may be expressed as a log likelihood ratio (LLR). Let $l_i(x)$ denote the label on the ith bit of x.

For each data bit, $b_i$, the posterior soft information (LLR) coming out of the ith bit of the demodulator can be defined based on the probability ratio $p(b_i=0|y)/p(b_i=1|y)$ where $p(b_i=0|y)$ is the probability that bit $b_i$ is a 0 and $p(b_i=1|y)$ is the probability that bit $b_i$ is a 1. The LLR can be expressed as:

$$L_i(b_i \mid y) = \log\left(\frac{p(b_i=0 \mid y)}{p(b_i=1 \mid y)}\right) \quad [7]$$

$$= \log\left(\frac{\sum_{x \in \chi_0^i} p(x \mid y)}{\sum_{x \in \chi_1^i} p(x \mid y)}\right)$$

$$= \log\left(\frac{\sum_{x_j \in \chi_0^i} p(y \mid x_j) p(x_j)}{\sum_{x_j \in \chi_1^i} p(y \mid x_j) p(x_j)}\right).$$

In the absence of any prior information, [7] reduces to $$L_i(b_i \mid y) = \log\left(\frac{\sum_{x_j \in \chi_0^i} p(y \mid x_j)}{\sum_{x_j \in \chi_1^i} p(y \mid x_j)}\right) \quad [8]$$

In some implementations, the LLR for each bit is expressed in terms of a signed number. For example, the signed numbers can range from +10 to −10. The sign of the number represents the likely state of the bit, with a positive sign representing the logic state 1 and a negative sign representing the logic state 0. The magnitude of the number represents the degree of confidence in the estimated logic state. For example, a +1 output from the demodulator 232 can indicate that the bit is estimated to be a logic one, but confidence is low. A +5 can indicate that the bit is estimated to be a logic one and a +10 can represent that the bit is estimated to be logic one with high confidence. A −4 indicates that the bit is probably a logic zero.

Defining a vector $\tilde{l}^i(x)=\{l^j(x)\}$, $j \neq i$ of size (m−1) and assuming the independence of prior bit information, $$p(x) = p(l^i(x), \tilde{l}^i(x)) = p(l^i(x)) p(\tilde{l}^i(x)), \quad [9]$$

then $$L_i(b_i | y) = \log\left(\frac{\sum_{x_j \in \chi_0^i} p(y|x_j)p(l^i(x_j)=0)p(\tilde{l}^i(x_j))}{\sum_{x_j \in \chi_1^i} p(y|x_j)p(l^i(x_j)=1)p(\tilde{l}^i(x_j))}\right). \quad [10]$$

For $x_j \in \chi_b^i$, $l^i(x_j)=b_i$, $L_i(b_i|y)$, Equation [10] can be expressed as:

$$L_i(b_i | y) = L_i(b_i) + \log\left(\frac{\sum_{x_j \in \chi_0^i} p(y|x_j)p(\tilde{l}^i(x_j))}{\sum_{x_j \in \chi_1^i} p(y|x_j)p(\tilde{l}^i(x_j))}\right), \quad [11]$$

where $$L_i(b_i) = \log\left(\frac{p(b_i=0)}{p(b_i=1)}\right). \quad [12]$$

Two types of prior information include prior information which comes from the decoder (e.g., LDPC decoder) and another source of prior information which comes from an external source. For example, the external source may provide information on position (beginning of page, end of page) that are more error prone. With prior information coming from the decoder denoted c, and prior information coming from the external source denoted $\bar{c}$, then:

$$L_i(b_i) = L_i^{(c)}(b_i) + L_i^{(\bar{c})}(b_i). \quad [13]$$

The extrinsic soft information is by definition $L_i^e(y) = L_i(b_i|y) - L_i^{(c)}(b_i)$, therefore from [11] and [13]:

$$L_i^e(y) = L_i^{(\bar{c})}(b_i) + \log\left(\frac{\sum_{x_j \in \chi_0^i} p(y|x_j)p(\tilde{l}^i(x_j))}{\sum_{x_j \in \chi_1^i} p(y|x_j)p(\tilde{l}^i(x_j))}\right). \quad [14]$$

Dividing both the numerator and denominator of the above equation with $p(\tilde{b}_i=1)$, where $\tilde{b}_i = b_1 b_2 \ldots b_m$, i.e., the vector without $b_i$, then:

$$L_i^e(y) = L_i^{(\bar{c})}(b_i) + \log\left(\frac{\sum_{x_j \in \chi_0^i} p(y|x_j)\frac{p(\tilde{b}_i=\tilde{l}^i(x_j))}{p(b_i=1)}}{\sum_{x_j \in \chi_1^i} p(y|x_j)\frac{p(\tilde{b}_i=\tilde{l}^i(x_j))}{p(b_i=1)}}\right), \quad [15]$$

or $$L_i^e(y) = L_i^{(\bar{c})}(b_i) + \log\left(\frac{\sum_{x_j \in \chi_0^i} p(y|x_j)\left[\prod_{k \neq i} \frac{p(b_k=l^k(x_j))}{p(b_k=1)}\right]}{\sum_{x_j \in \chi_1^i} p(y|x_j)\left[\prod_{k \neq i} \frac{p(b_k=l^k(x_j))}{p(b_k=1)}\right]}\right). \quad [16]$$

Let $B \in \{0,1\}$ and define $$L_i(b_i, B) = \log\left(\frac{p(b_i=B)}{p(b_i=1)}\right) = \begin{cases} L_i(b_i) & B=0 \\ 0 & B=1, \end{cases} \quad [17]$$

then, inserting [17] into [16], $$L_i^e(y) = L_i^{(\bar{c})}(b_i)\log\left(\frac{\sum_{x_j \in \chi_0^i} p(y|x_j)\left[\prod_{k \neq i} e^{L_k(b_k, l^k(x_j))}\right]}{\sum_{x_j \in \chi_1^i} p(y|x_j)\left[\prod_{k \neq i} e^{L_k(b_k, l^k(x_j))}\right]}\right). \quad [18]$$

Substituting [4] into [18], $$L_i^e(y) = L_i^{(\bar{c})}(b_i) + \log\left(\frac{\sum_{x_j \in \chi_0^i} e^{-\frac{(y-x_j)^2}{2\sigma_j^2} - \log(\sigma_j) + \sum_{k \neq i} L_k(b_k, l^k(x_j))}}{\sum_{x_j \in \chi_1^i} e^{-\frac{(y-x_j)^2}{2\sigma_j^2} - \log(\sigma_j) + \sum_{k \neq i} L_k(b_k, l^k(x_j))}}\right). \quad [19]$$

During the demodulation process, the right hand side of equation [19], may be obtained, for example, from a look up table with input y.

In one example of multi-level memory, with m=2 and natural mapping, $\chi_0^0=\{0,1\}$, $\chi_1^0=\{2,3\}$, $\chi_0^1=\{0,2\}$, $\chi_1^1=\{1,3\}$ the two bit level extrinsic information can be calculated as:

$$L_i^e(y) = \log\left(\frac{\sum_{x_j \in \chi_0^1} e^{-\frac{(y-x_j)^2}{2\sigma_j^2} - \log(\sigma_j) + L_{\bar{i}}(b_{\bar{i}}, l^{\bar{i}}(x_j))}}{\sum_{x_j \in \chi_0^1} e^{-\frac{(y-x_j)^2}{2\sigma_j^2} - \log(\sigma_j) + L_{\bar{i}}(b_{\bar{i}}, l^{\bar{i}}(x_0))}}\right), \text{ or} \quad [20]$$

$$L_0^e(y) = \log\left(\frac{e^{-\frac{(y-x_0)^2}{2\sigma_0^2} - \log(\sigma_0) + L_1(b_1, l^1(x_0))} +}{e^{-\frac{(y-x_1)^2}{2\sigma_1^2} - \log(\sigma_1) + L_1(b_1, l^1(x_1))}}{e^{-\frac{(y-x_2)^2}{2\sigma_2^2} - \log(\sigma_2) + L_1(b_1, l^1(x_2))} +}{e^{-\frac{(y-x_3)^2}{2\sigma_3^2} - \log(\sigma_3) + L_1(b_1, l^1(x_3))}}\right) \text{ and} \quad [21]$$

$$L_1^e(y) = \log\left(\frac{e^{-\frac{(y-x_0)^2}{2\sigma_0^2} - \log(\sigma_0) + L_0(b_0, l^0(x_0))} +}{e^{-\frac{(y-x_2)^2}{2\sigma_2^2} - \log(\sigma_1) + L_0(b_0, l^0(x_2))}}{e^{-\frac{(y-x_1)^2}{2\sigma_1^2} - \log(\sigma_1) + L_0(b_0, l^0(x_2))} +}{e^{-\frac{(y-x_3)^2}{2\sigma_3^2} - \log(\sigma_3) + L_0(b_0, l^0(x_3))}}\right). \quad [22]$$

For a demodulator providing soft information (see, e.g., Equation [8]), with programmable $\{x_j, \sigma_j\}$, the demodulator can be implemented as a memory of size $2^{k_a} \times (m \times k_s)$, where $k_a$ could be the analog to digital converter (ADC) bus size and $k_s$ is the bus size of soft information. For example, with m=2, $(k_a,k_s)=(6, 4)$, the memory size becomes 64×8 which, when implemented in a memory chip having a 40 nm pitch occupies a small area.

A demodulator that inputs soft information and outputs soft information (see, e.g., Equation [18]) is more involved. The demodulator can be implemented as a memory of size $2^{k_a+(m-1)k_s} \times (m \times k_s)$. For example, with m=2, $(k_a,k_s)=(6,4)$, the memory size becomes 1024×8.

Alternatively, [18] can be approximated as:

$$L_i^e(y) = \log\left(\sum_{x_j \in \chi_0^i} e^{-\frac{(y-x_j)^2}{2\sigma_j^2} - \log(\sigma_j) + \sum_{k \neq i} L_k(b_k, l^k(x_j))}\right) - \log\left(\sum_{x_j \in \chi_1^i} e^{-\frac{(y-x_j)^2}{2\sigma_j^2} - \log(\sigma_j) + \sum_{k \neq i} L_k(b_k, l^k(x_j))}\right) \quad [23]$$

or, $$L_i^e(y) = \max_{x_j \in \chi_0^i}\left\{-\frac{(y-x_j)^2}{2\sigma_j^2} - \log(\sigma_j) + \sum_{k \neq i} L_k(b_k, l^k(x_j))\right\} - \max_{x_j \in \chi_1^i}\left\{-\frac{(y-x_j)^2}{2\sigma_j^2} - \log(\sigma_j) + \sum_{k \neq i} L_k(b_k, l^k(x_j))\right\} \quad [24]$$

The branch metric $$-\frac{(y-x_j)^2}{2\sigma_j^2} - \log(\sigma_j)$$

can also be implemented as a memory with size $2^{k_a} \times (M \times k_b)$, where $k_b$ is the bus size of the branch metric. For example, with m=2, $k_a=6$, $k_b=5$, the branch metric memory is 64×20. To implement [24], each term in the max function needs m−1 adders, and maximization is over $2^{m-1}$ terms. Therefore, the total requirement is $m2^m+1$ adders and a memory size $2^{k_a} \times (M \times k_b)$. For the above example, the memory would be 64×20 followed by 9 adders. Additional information regarding iterative demodulation and decoding for multi-page memory architecture is described in commonly owned U.S Publication No. 2011/0280069 filed concurrently with the present application and incorporated herein by reference.

Returning to FIG. 7, the decoder 233 uses the output from the demodulator 232, including the data estimates and the soft information, to decode the jointly encoded MSB page and the LSB pages. The decoder may also generate its own soft information, e.g., using the parity bits that provides an indication of the confidence of the decoded data bits. In some implementations, decoder 233 may comprise a low density parity check (LDPC) decoder. The MSB and LSB pages that are jointly encoded into a single code word are stored together in the memory cells of the same physical page. As the joint code word is decoded, the information obtained in demodulating the MSB page can be used in decoding the LSB page and/or generating the soft information for the LSB page. Information obtained in demodulating the LSB page can be used in decoding the MSB page and/or generating the soft information for the MSB page. Additionally, information obtained in decoding the MSB page may be used in further refining the demodulation of the MSB and LSB pages and information obtained in decoding the LSB page may be used in further refining the demodulation of the MSB and LSB pages.

As the joint code word that encodes the logical pages is decoded, based on the results of the parity checks, the decoder generates updated soft information indicating the confidence or reliability of each bit decision. The soft decisions produced by decoder 233 and the demodulator 232 can be generated with a technique called "message passing." For example, decoder 233 can upgrade or degrade the data confidence information received from the demodulator depending on whether the code word parity bits match or do not match the corresponding data in the code word. The updated soft information is passed back to demodulator 232 which uses the updated soft information provided by decoder 233 as extrinsic information and again interprets the sensed voltage from the memory cells to produce updated estimates of the data and soft information. The demodulator's estimates and soft information are again passed to decoder 233. This iterative process may continue any number of times until the decoder 233 achieves convergence of the joint code word, or until a predetermined number of iterations are performed, or until the decoder 232 determines that the joint code word cannot be converged.

The iterative demodulation/decoding processes described herein are particularly useful for memory devices employing multi-level coding. As previously discussed, the MSB and LSB pages are jointly encoded into a single code word which is stored in a physical memory page. Each bit of the MSB page has a corresponding bit from the LSB page. These bits are related to each other because they are stored together as a voltage level present on a memory cell. Thus, information gained from demodulating and/or decoding one of the pages can be used to improve the process of demodulating and decoding of the other page, and vice versa, thereby increasing the efficiency of the demodulation/decoding process.

Figure 8:
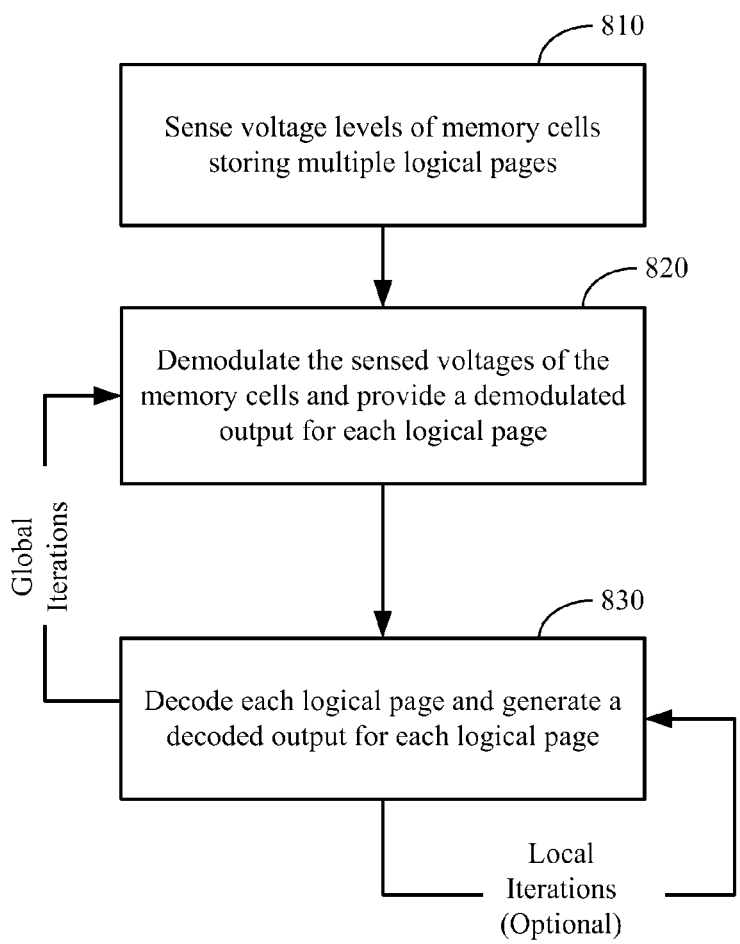
FIG. 8 is a flow diagram illustrating an iterative process for demodulation and decoding data stored in multi-page architecture memory systems.

FIG. 8 is a flow diagram illustrating a method of accessing data stored in a multi-level NVM device using multi-page architecture. The voltage level of each memory cell is sensed 810 and the sensed voltage is demodulated 820 to produce a demodulated output for each page. Each of the demodulated outputs are decoded 830 to produce a decoded output for each page. Decoding the code word that jointly encodes the multiple pages and demodulating the multiple logical pages proceeds iteratively, providing hard data estimates for the data bits with or without soft information giving the reliability of the hard data estimates exchanged between the decoding and demodulating steps.

In some implementations, only the hard data estimates, i.e., the demodulated bits read from the memory cell or the decoded output from the decoder (without confidence information) are iteratively passed between the decoder and the demodulator. In other implementations, the decoder iteratively passes the hard data estimates to the demodulator and also calculates soft information, e.g., an LLR, which is also passed to the demodulator. In this scenario, the demodulator uses the soft information provided by the decoder, but does not calculate or provide soft information to the decoder. For example, the demodulator does not itself calculate confidence information to update the soft information provided by the decoder. In yet another implementation, both the decoder and the demodulator provide a hard data estimates and soft information. The demodulator provides to the decoder hard data estimates and soft information for each cell in which the multiple logical pages are stored. The decoder also provides hard data estimates and soft information for each bit of each page to the demodulator. These processes proceed iteratively until convergence, timeout, or another criterion is achieved.

Iterations between demodulating and decoding each page can involve extrinsic information in the form of updated data bit estimates and/or updated soft information which are passed between the demodulator and the decoder. These iterations that pass extrinsic information between the demodulator and decoder are designated global iterations. In addition to the global iterations, one or more of the demodulator and the decoder may optionally perform local iterations. For example, the decoder may be a low density parity check (LDPC) decoder, a turbo coder, or other type of iterative decoder which iterates the decoding process locally within the decoder (without extrinsic information) to obtain convergence for the code words.

Figure 9:
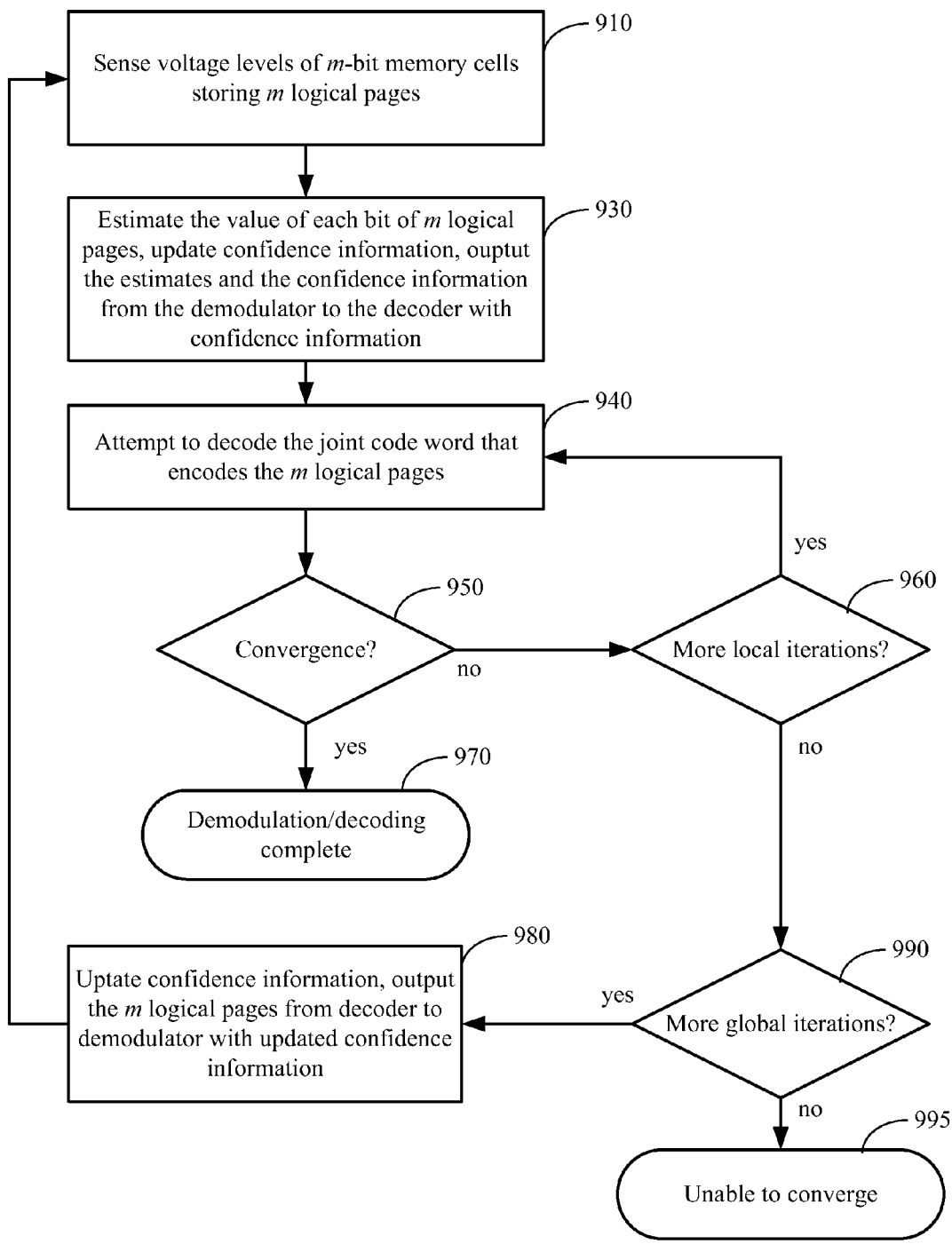
FIG. 9 is a flow diagram illustrating a process for demodulation and decoding data that includes performing both global iterations between the demodulator and the decoder and local iterations within the decoder.

FIG. 9 is a flow diagram illustrating a process of accessing a solid state NVM device comprising multi-level memory cells capable of storing m bits per memory cell. Each of the m bits of a memory cell are arranged in one of m logical pages of each physical page. The m logical pages stored in a physical page are jointly encoded into a single code word. The process includes performing both global iterations between the decoder and the demodulator and local iterations within the decoder. According to the illustrated process, the voltage levels of the multi-level memory cells are sensed 910. The sensed voltage levels are processed in the demodulator which provides 930 an estimate of the m bit digital state of each memory cell and outputs the estimates as m logical pages of data to the decoder. In addition to the estimate of value of the bits of the m logical pages of data, the demodulator also provides the decoder with soft information for each bit of each logical page. The soft information may be derived from the sensed voltage levels of the memory cells, or noise variance, and may be expressed as an LLR, for example.

The decoder inputs the estimate of the m logical pages of data and the soft information from the demodulator and attempts to decode 940 the joint code word that encodes the m logical pages using the estimates and soft information. The decoder performs 960 up to a predetermined number of local decoder iterations. If the joint code word converges 950, then the decoding process is complete 970 and the decoded data for the requested page or for each page of the m pages is available at the output of the memory device. If the joint code word does not converge 950, additional global iterations between the decoder and the demodulator may be performed 990. The decoder updates 980 the soft information, e.g. updates the LLR, and outputs the decoded data and the updated soft information to the demodulator for another global iteration. The sensed voltage levels are re-assessed by the demodulator using the decoded data and the updated soft information from the decoder. The process may involve up to a predetermined number of global iterations 990. After globally iterating the predetermined number of times, the process may exit if convergence is not achieved 995.

Figure 10:
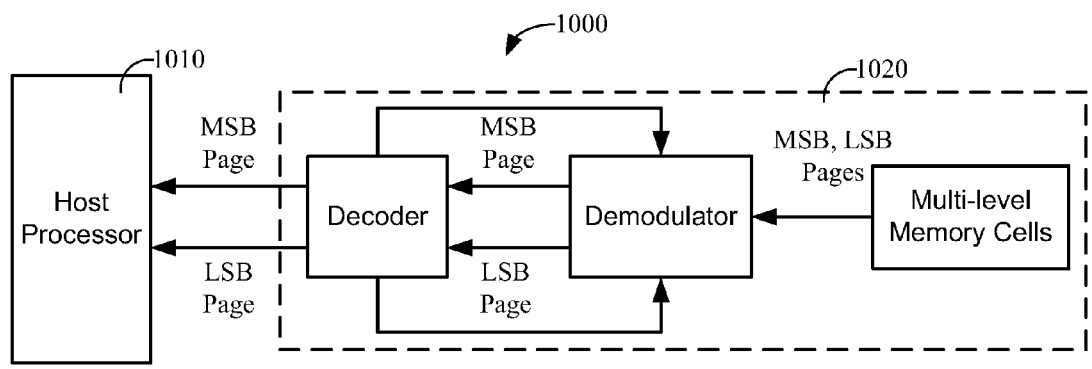
FIG. 10 illustrates a block diagram of a system that includes a memory device that is sending a physical page including MSB and LSB pages to a host processor.
Figure 11:
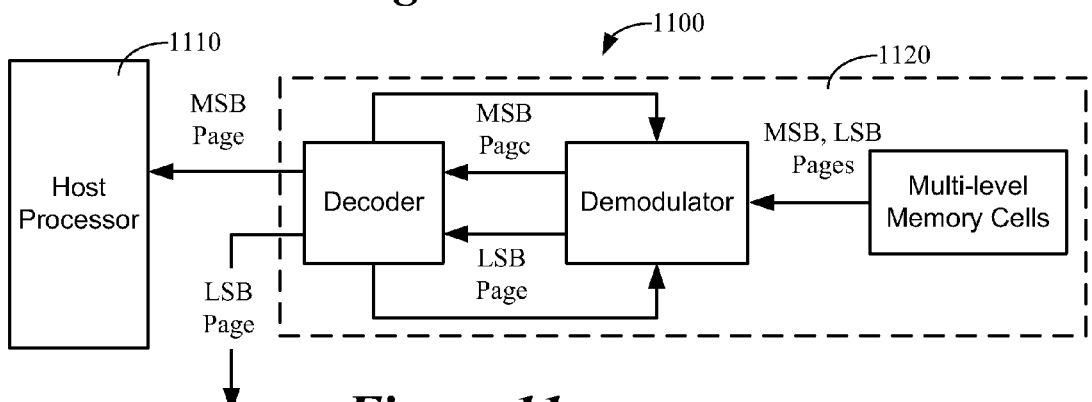
FIG. 11 illustrates a block diagram of a system that is sending a requested decoded page to a host processor and is discarding or ignoring a non-requested decoded page.
Figure 12:
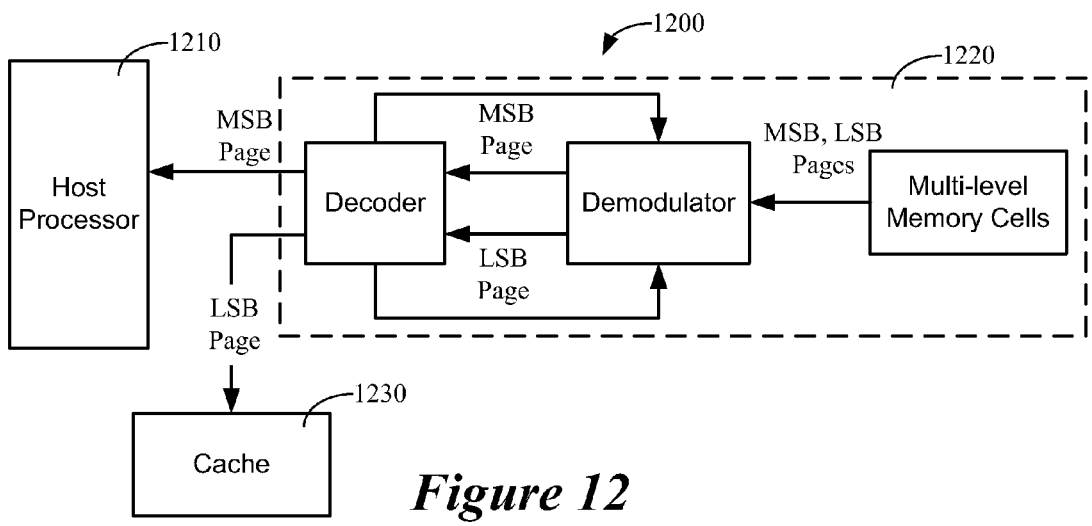
FIG. 12 illustrates a block diagram of a system including a memory device that is sending a requested decoded page to a host processor and is caching a non-requested decoded page.

FIGS. 10-12 are block diagrams of systems that handle the decoded MSB and LSB logical pages of data in various ways. In each example, at least the MSB page is requested by the host processor (or other requesting device). In FIG. 10, the host processor 1010 requests data in physical page units, i.e., both the MSB and LSB pages. In FIGS. 11-12, the MSB page is requested and the LSB page is not requested. Alternatively, the LSB page may be the requested page and the MSB may be the non-requested page. In implementations that include a greater number of bits stored per memory cell (greater than 2 bits), more than one logical page may be requested and/or more than one logical page may be non-requested.

FIG. 10 illustrates a system 1000 including a host processor 1010 and a solid state NVM device 1020 that is providing a requested physical page (i.e., both the MSB page and the LSB page that were jointly encoded in the physical page) to the host processor 1010. For example, the processor 1010 may be performing a block read of all physical pages in a block, and as each physical page is requested, the memory device 1020 returns both the MSB page and the LSB page.

FIG. 11 shows a block diagram of a system 1100 including a solid state NVM device 1120 that is transferring the requested logical page to the host processor 1110 and is discarding or ignoring the non-requested page. The non-requested page may be discarded or ignored, for example, if it is unlikely that the non-requested page will be needed soon.

FIG. 12 shows a block diagram of a system 1200 comprising a NVM device 1220 that includes a cache 1230 configured to store one or more non-requested pages. The cached pages may be temporarily stored until requested by the host processor 1210 or until overwritten by subsequently cached pages, for example.

Any of the processes illustrated in FIGS. 10-12 may be alternatively available. When the NVM device receives a request for a logical page from a host processor, either the host processor may indicate how to handle the non-requested page, or the NVM device itself may determine how to handle the non-requested page. For example, in some scenarios, the host processor may indicate that it will accept both the requested page and the non-requested page. In some scenarios, the process for handling the non-requested page may be determined by the NVM device based on prior host processor activity. The NVM device may determine the likelihood that the non-requested page will be requested within a predetermined time interval. If it is likely that the host processor will request the non-requested page within the predetermined time interval, then the non-requested page may be stored in cache. However, if it is unlikely that the non-requested page will be requested during the predetermined time interval, then the non-requested page may be discarded.

Figure 13:
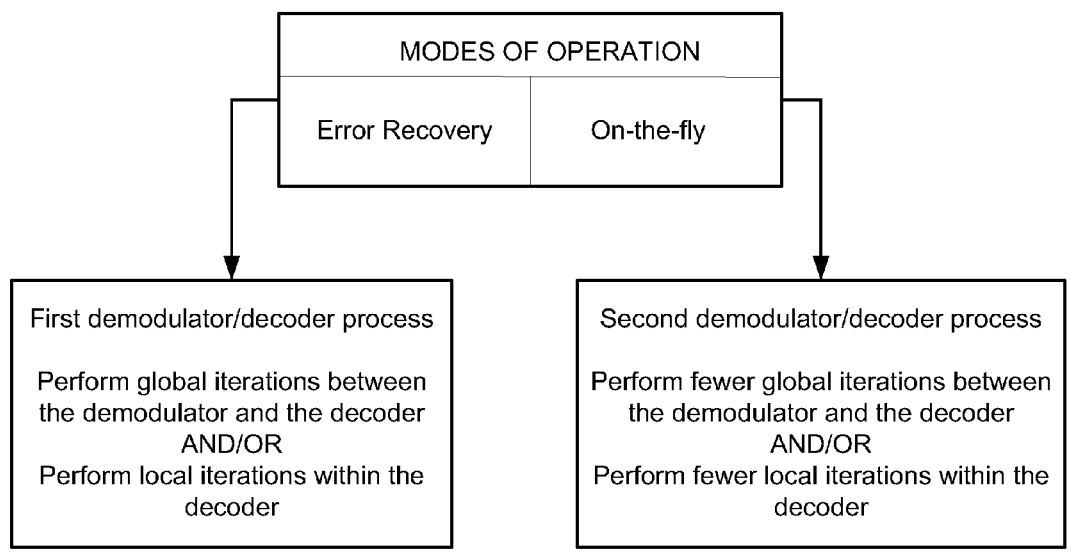
FIG. 13 is a diagram illustrating multiple operation modes, including an error recover mode and an on-the-fly mode.

As illustrated by FIG. 13, a memory device may operate in an error correction mode, designated error recovery (ER) mode, or may operate in a non-error correction mode, designated on-the-fly (OTF) mode. When operating in the OTF mode, the memory device may attempt to detect that the data contains errors but may or may not attempt to correct the errors. Alternatively, some OTF modes may not even attempt to detect data errors. When operating in the ER mode, the memory device attempts to detect that the data contains errors and also attempts to correct the data errors.

OTF modes that do not provide error correction may be used, for example, when the number of the data errors is expected to be low and/or when access speed is more important than error correction and/or when the data can be re-transmitted if an error occurs. When data accuracy is important, and/or access speeds can be slower, and/or if re-transmission is not available, then the memory device may operate in ER mode. The device may switch between the ER mode and the OTF mode depending on the requirements of the operation.

In some implementations, the ER and OTF modes may be provided by two output circuits, at least one output circuit having a substantial amount of circuitry that is not common to the other output circuit. The ER circuitry may be more complex than the OTF circuitry. In this implementation, the more complex ER mode circuitry will be triggered for use when the NVM device is operating in ER mode and the OTF circuitry will be triggered for use when the NVM device is operating in OTF mode.

In another implementation, both the OTF and ER modes may be provided by an output circuit capable of operating in an ER mode during a first time period and an OTF mode during a second time period. In this implementation, the ER and OTF modes use substantially the same circuitry but the circuitry performs a more complex process when operating in the ER mode than when operating in the OTF mode. For example, when operating in the ER mode, the demodulator and decoder perform global iterations and/or the decoder performs local iterations. When operating in OTF mode, the demodulator and decoder perform fewer global iterations than the number of global iterations performed in the ER mode, or the OTF mode may perform no global iterations. When operating in OTF mode, the decoder performs fewer local iterations than the number of local iterations performed the ER mode, or the OTF mode may perform no local iterations.

Figure 14:
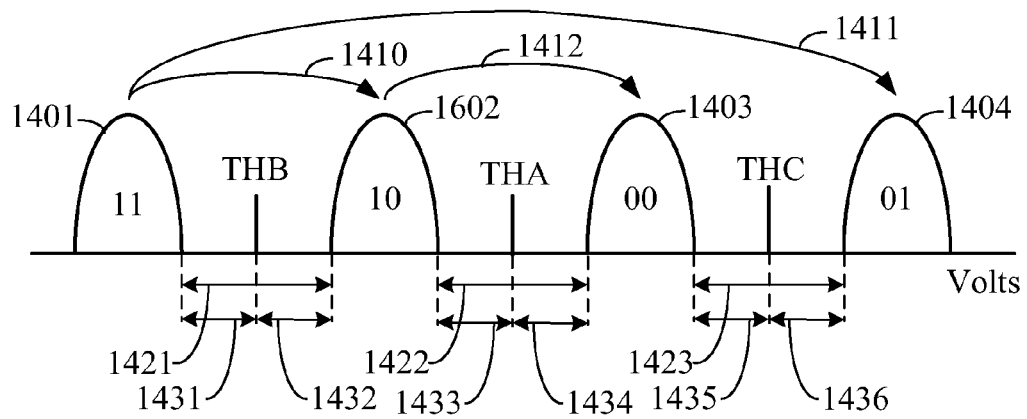
FIG. 14 illustrates a voltage distribution pattern of the four voltage distributions that correspond to the four digital states of a two bit memory cell.

A technique to lower the error rate of the LSB page involves altering the distributions of the voltages stored in the memory cells. FIG. 14 illustrates voltage distributions for each 2 bit symbol of a memory cell array. In this example, the digital state 11 requires the lowest voltage and may represent the erased state. The voltages representing 11 fall within distribution 1401. Similarly, after programming, the voltages representing 10 fall within distribution 1402, the voltages representing 00 fall within distribution 1403, and the voltages representing 01 fall within distribution 1404. Prior to programming a memory cell array block, the memory cells are erased, bringing all the bits to their erased state, which in this example is 11. The LSB is programmed into the memory cell first. If the LSB is 1, no programming voltage is applied and the memory cell remains in the erased state, 11. If the LSB is 0, then a programming voltage is applied which raises the voltage stored in the memory cell to the voltage representing the digital state 10 (path 1410). Next, the MSB is programmed into the memory cell. If the MSB to be programmed is a 1, then no programming voltage is applied, because the memory cell is already in the correct state, either 11 or 10, depending on the LSB programming. If the MSB to be programmed is a 0 and the memory cell is in the 11 state (LSB equal to 1), then a programming voltage is applied which raises the voltage stored in the memory cell to the voltage 01 (path 1411). If the MSB to be programmed is a 1 and the memory cell is in the state (LSB equal to 0), then a programming voltage is applied which raises the voltage stored in the memory cell to the voltage 00 (path 1412).

Programming may occur, for example, applying the programming voltage to the memory cells in steps to raise the memory cell voltage to the desired level. In some applications, after applying the programming voltage, the stored voltage level of the memory cell is verified. Multiple programming cycles and/or verify cycle may occur until the stored voltage levels on the memory cells corresponds to the desired distribution, e.g., distribution 1401, 1402, 1403, 1404. The shape of the distribution 1401, 1402, 1403, 1404 can be controlled based on the number of programming steps. Decreasing the variance of a distribution can be achieved if many programming steps are used, wider distributions require fewer programming steps. Correspondingly, programming narrow distributions is slower than programming wider distributions due to the added programming steps used in programming the narrower distributions when compared to the wider distributions.

Reading the digital state of a memory cell may be accomplished by comparing the sensed voltage levels of the memory cells to one or more thresholds. Comparison to a first threshold A, THA, discriminates the MSB bit of the digital state stored in the memory cell. If the sensed voltage is lower than THA, then the state of the MSB is 1 and if the sensed voltage is greater than THA, then the state of the MSB is 0.

Reading the LSB requires comparison to at least two thresholds. If the sensed voltage is less than THA, then comparison to threshold B, THB, discriminates between an LSB of 1 and an LSB of 0. If the sensed voltage is less than THB, then the LSB stored in the memory cell is 1. If the sensed voltage is greater than THB, then the LSB stored in the memory cell is 0. If the sensed voltage is greater than THA, then comparison to threshold C, THC, discriminates between an LSB of 1 and an LSB of 0. If the sensed voltage is greater than THC, then the LSB is 1. If the sensed voltage is less than THC, then the LSB is 0.

The distances between the edges of the distributions 1401, 1402, 1402 and the location of the thresholds affect the error rate of the memory cells. If the edges of the distributions 1401, 1402, 1402 overlap, then data errors can occur. Additionally, if any of distributions overlap the thresholds THA, THB, THC, then data errors can occur. Thus it is desirable to maintain acceptable distribution margins 1421, 1422, 1423 between the edges of the distributions 1401, 1402, 1402 and to maintain acceptable threshold margins 1431, 1432, 1433, 1434, 1435, 1436, between the edges of the distributions 1401, 1402, 1402 and the thresholds, THA, THB, THC. FIG. 14 illustrates distribution margins 1421, 1422, 1423 between an edge of one distribution and an edge of an adjacent distribution that are approximately uniform. FIG. 14 illustrates threshold margins 1431, 1432, 1433, 1434, 1435, 1436, between a distribution edge and a threshold that are approximately uniform.

Figure 15:
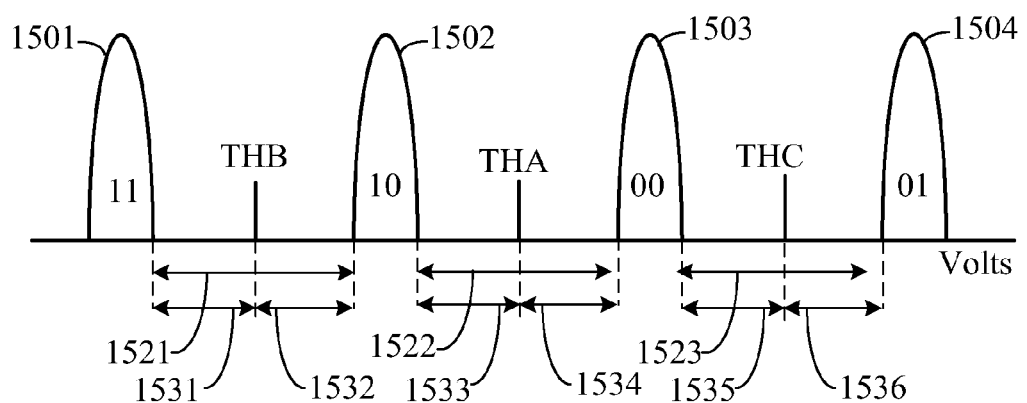
FIG. 15 illustrates narrower voltage distributions which increase the distribution margins and threshold margins.

FIG. 15 illustrates voltage distributions 1501, 1502, 1503, 1504 that have a smaller variance than the voltage distributions 1401, 1402, 1403, 1404 shown in FIG. 14. Decreasing the variance of voltage distributions increases both the distribution margins 1521, 1522, 1523 and the threshold margins 1531, 1532, 1533, 1534, 1535, 1536. This increase in distribution margins and threshold margins reduces errors and is achieved at the expense of longer programming times. The voltage distribution pattern illustrated in FIG. 15 involves distribution margins 1521, 1522, 1523 and threshold margins 1531, 1532, 1533, 1534, 1535, 1536 that are substantially uniform.

Figure 16A:
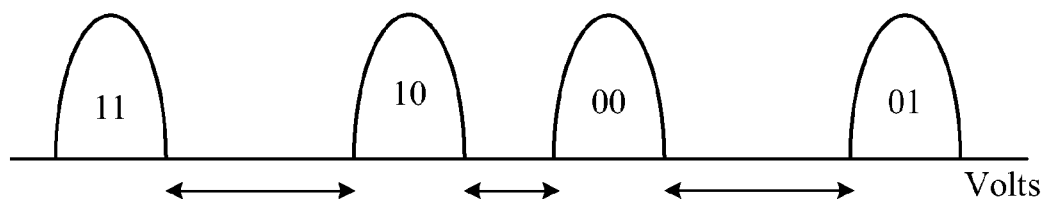
FIG. 16A illustrates a voltage distribution pattern resulting from reducing the voltage difference between the 10 and 00 distributions.
Figure 16B:
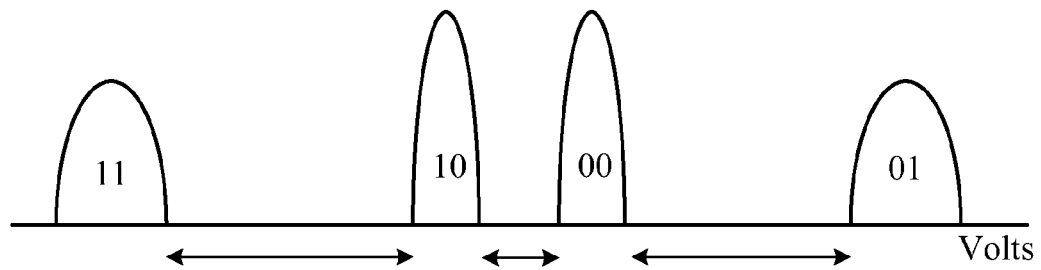
FIG. 16B illustrates a voltage distribution pattern resulting from reducing the voltage difference between the 10 and 00 and decreasing the variance of the distributions.

Program disturbs and read disturbs are more likely to occur at lower voltage levels, such as digital states 11 and 10 which affect the LSB. FIGS. 16A and 16B illustrate various voltage distribution patterns that have non-uniform distribution margins which may be used to decrease the error rate of the LSB page. For example, as illustrated in FIG. 16A, the 10 and 00 distributions may be shifted closer together and towards each other, which correspondingly increases the margin between the 11 distribution and the 10 distribution and between the 00 distribution and the 01 distribution. The distribution margins are no longer uniform, and the increased margin between the 11 and 10 distributions makes it easier to discriminate between an LSB of 1 and an LSB of 0 when the MSB is 1. FIG. 16B illustrates both shifting the 10 and 00 distributions and decreasing the variance of the 10 and 00 distributions. This distribution pattern may decrease errors in the LSB page without substantially affecting the error rate for the MSB page. A number of additional distribution patterns are possible and are considered to fall within this disclosure.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method of storing data in a solid state non-volatile memory device, comprising:
   jointly encoding multiple logical pages of data in a single joint code word that includes data bits and parity bits;
   storing the jointly encoded logical pages into a physical page of memory cells of the memory device, each of the memory cells arranged to store multiple bits including at least a first bit and a second bit, the storing comprising:
      storing a first logical page of the jointly encoded logical pages in the physical page as first bits of the memory cells while temporarily caching a second logical page of the jointly encoded logical pages; and
      after storing the first logical page as the first bits of the memory cells, storing the second logical page in the physical page as second bits of the memory cells.

2. The method of claim 1, wherein jointly encoding comprises jointly encoding using a low density parity check code.

3. The method of claim 1, wherein the all of the parity bits are stored in the second page.

4. The method of claim 1, wherein one or more logical pages of data are stored in the memory cells between storing the first logical page and storing the second logical page.

5. The method of claim 1, wherein:
   each of the memory cells are capable of storing more than two bits of data; and
   storing the jointly encoded logical pages further comprises, after storing the first logical page as the first bits of the memory cells and storing the second logical page as the second bits of the memory cells, storing one or more additional logical pages as one or more additional bits of the memory cells.

6. The method of claim 1, wherein:
   the memory device is arranged so that only one physical page is accessible by activating a word line; and
   the only one physical page is capable of storing a code word representing jointly encoded logical pages.

7. The method of claim 1, wherein:
   the memory device is arranged so that more than one physical page is accessible by activating a word line; and
   each physical page is capable of storing a code word representing jointly encoded logical pages.

8. The method of claim 1, further comprising:
   sensing voltage levels of the memory cells;
   demodulating the jointly encoded logical pages responsive to the sensed voltage levels including providing a demodulated output for each logical page of the jointly encoded logical pages; and
   generating a decoded output for each logical page of the jointly encoded logical pages, wherein generating the decoded output for each logical page comprises:
      receiving the demodulated output for the logical page;
      decoding the logical page responsive to the demodulated output; and
      iterating between decoding and demodulating the jointly encoded logical pages including exchanging information between the decoding and the demodulating.

9. The method of claim 8, exchanging the information comprises exchanging one or both of hard data estimates and data confidence information.

10. The method of claim 9, wherein the demodulator is configured to determine the data confidence information using a look-up table.

11. A solid state non-volatile memory device, comprising:
   an array of memory cells;
   a joint encoder configured to jointly encode logical pages of data in a single joint code word comprising data bits and parity bits;
   a modulator configured to store the jointly encoded logical pages into a physical page of the memory cells, each of the memory cells arranged to store multiple bits including at least a first bit and a second bit; and
   a cache configured to temporarily cache a second logical page of the jointly encoded logical pages while a first logical page of the jointly encoded logical pages is being stored in the memory cells, wherein the modulator further configured to retrieve the second logical page from the cache and to store the second logical page as second bits of the memory cells after storing the first logical page.

12. The device of claim 11, wherein the joint encoder is configured to jointly encode the multiple logical pages using a low density parity check code.

13. The device of claim 11, wherein some of the parity bits are stored in the second logical page and some of the parity bits are stored in the first logical page.

14. The device of claim 11, wherein the modulator is configured to store at least two logical pages of data in the memory cells between storing the first logical page in the memory cells and storing the second logical page in the memory cells.

15. The device of claim 11, wherein each of the memory cells are capable of storing more than two bits of data.

16. The device of claim 11, wherein:
   the memory cells are arranged so that only one physical page is accessible by activating a word line; and
   the only one physical page is capable of storing a code word representing jointly encoded logical pages.

17. The device of claim 11, wherein:
   the memory cells are arranged so that more than one physical page is accessible by activating a word line; and
   each physical page is capable of storing a code word representing jointly encoded logical pages.

18. The device of claim 11, further comprising:
   sensor circuitry configured to sense voltage levels indicative of the multiple bits stored in the memory cells;
   a demodulator configured to provide a demodulated output for each logical page of the jointly encoded logical pages responsive to the sensed voltage levels; and
   a decoder configured to receive a demodulated output for each logical page of the jointly encoded logical pages from the demodulator and to send an output to the demodulator, the decoder and the demodulator configured to exchange information and to iteratively perform the processes of decoding and demodulating the jointly encoded logical pages.

19. The device of claim 18, wherein:
   the information includes data confidence information; and
   the demodulator is configured to implement a look-up table to determine the data confidence information.

20. The device of claim 18, wherein the information comprises one or both of hard data estimates and confidence information.

* * * * *

UNITED STATES PATENT AND TRADEMARK OFFICE
CERTIFICATE OF CORRECTION

PATENT NO. : 8,254,167 B2  
APPLICATION NO. : 12/781774  
DATED : August 28, 2012  
INVENTOR(S) : Ara Patapoutian et al.

Page 1 of 1

It is certified that error appears in the above-identified patent and that said Letters Patent is hereby corrected as shown below:

On the Title Page, Item (73): "Seagate Technologies LLC" should read --Seagate Technology LLC--.

Signed and Sealed this
Fourth Day of June, 2013

Teresa Stanek Rea
*Acting Director of the United States Patent and Trademark Office*